(12) United States Patent
Pertijs

(10) Patent No.: US 7,986,164 B2
(45) Date of Patent: *Jul. 26, 2011

(54) INTEGRATED CIRCUIT WITH PIN-SELECTABLE MODE OF OPERATION AND LEVEL-SHIFT FUNCTIONALITY AND RELATED APPARATUS, SYSTEM, AND METHOD

(75) Inventor: Michiel Antonius Petrus Pertijs, 's Hertogenbosch (NL)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/800,170

(22) Filed: May 10, 2010

(65) Prior Publication Data

US 2010/0225352 A1 Sep. 9, 2010

Related U.S. Application Data

(63) Continuation of application No. 12/287,971, filed on Oct. 15, 2008, now Pat. No. 7,714,612.

(60) Provisional application No. 61/192,404, filed on Sep. 18, 2008, provisional application No. 61/192,446, filed on Sep. 18, 2008.

(51) Int. Cl.
*H03K 19/0175* (2006.01)

(52) U.S. Cl. .......................................... 326/62; 326/82

(58) Field of Classification Search ................... 326/37, 326/38, 62, 63, 68, 82–87
See application file for complete search history.

(56) References Cited

U.S. PATENT DOCUMENTS

| 4,618,785 | A | 10/1986 | van Tran |
| 5,204,557 | A | 4/1993 | Nguyen |
| 5,896,044 | A | 4/1999 | Walden |
| 6,104,732 | A | 8/2000 | Pearman |
| 6,370,075 | B1 | 4/2002 | Haeberli et al. |
| 6,373,285 | B1 | 4/2002 | Konishi |
| 6,661,696 | B2 * | 12/2003 | Schwartz et al. ............. 365/145 |
| 6,765,552 | B2 * | 7/2004 | Yamazaki et al. ............. 345/98 |
| 7,181,635 | B2 | 2/2007 | Byrne et al. |
| 7,573,327 | B1 | 8/2009 | Pertijs et al. |
| 7,584,314 | B1 | 9/2009 | Sauerwald |
| 2003/0142233 | A1 | 7/2003 | Eckhardt et al. |
| 2004/0008725 | A1 | 1/2004 | McNamara et al. |
| 2006/0109019 | A1 | 5/2006 | Liu |
| 2006/0244709 | A1 | 11/2006 | Lin |
| 2008/0284507 | A1 | 11/2008 | Pertijs et al. |

OTHER PUBLICATIONS

"Faraday SerDes IP, Universal Programmable SerDes IP," Faraday, 2 pages.

(Continued)

*Primary Examiner* — Don P Le

(57) ABSTRACT

An apparatus includes a digital interface circuit configured to provide a digital interface. The digital interface is configurable based on a mode of operation of the digital interface circuit. The apparatus also includes input and output level-shift circuits. The input level-shift circuit is configured to shift a voltage level of an input signal for the digital interface circuit. The output level-shift circuit is configured to shift a voltage level of an output signal from the digital interface circuit. The input level-shifting and the output level-shifting are based on first and second level-shift input voltages. The apparatus further includes a mode detector configured to identify at least two modes of operation for the digital interface circuit based on the first and second level-shift input voltages. For example, the digital interface circuit could be configured to function as a serial or parallel interface depending on which level-shift input voltage is greater.

20 Claims, 8 Drawing Sheets

OTHER PUBLICATIONS

"Serial Digital Interface Reference Design for Cyclone & Stratix Devices," Altera Corporation, Aug. 2004, ver. 1.1, 14 pages.
"3G, HD & SD Dual Output Cable Equalizer," Mindspeed Technologies, Inc., 2006, 2 pages.
Dave Bursky, "FPGA Combines Multiple Serial Interfaces and Logic," Electronic Design, Oct. 2, 2000, 5 pages.
"LMH0002, SMPTE 292M/259M Serial Digital Cable Driver," National Semiconductor Corporation, Oct. 2006, 6 pages.
"LMH0034, SMPTE 292M/259M Adaptive Cable Equalizer," National Semiconductor Corporation, Jun. 2006, 7 pages.
"SCAN25100, 2457.6, 1228.8, and 614.4 Mbps CPRI SerDes with Auto RE Sync and Precision Delay Calibration Measurement," National Semiconductor Corporation, Nov. 2006, 14 pages.
"LMH0040, 5:1 Serial Digital Video Serializer and Driver," National Semiconductor Corporation, Oct. 24, 2006, 11 pages.
"LMH0041, 1:5 Serial Digital Video Deserializer with Loopthrough," National Semiconductor Corporation, Dec. 1, 2006, 12 pages.
"LMH0046, HD/SD/ SDI Reclocker with Dual Differential Outputs," National Semiconductor Corporation, Jul. 2006, 12 pages.
Michael Kultgen, "Simple, Precise Instrumentation Amplifier Features Digitally Programmable Gains from 1 to 4096", Linear Technology Magazine, Mar. 2005, p. 16-19.
"Zero Drift, Precision Instrumentation Amplifier with Digitally Programmable Gain", Linear Technology Corporation 2004, p. 1-16.
"LMP8100 Programmable Gain Amplifier", National Semiconductor Corporation, Apr. 18, 2008, 30 pages.

* cited by examiner

INTEGRATED CIRCUIT WITH PIN-SELECTABLE MODE OF OPERATION AND LEVEL-SHIFT FUNCTIONALITY AND RELATED APPARATUS, SYSTEM, AND METHOD

CROSS-REFERENCE TO RELATED APPLICATIONS

This application is a continuation of prior U.S. patent application Ser. No. 12/287,971 filed on Oct. 15, 2008 now U.S. Pat No. 7,714,612.

This application claims priority under 35 U.S.C. §119(e) to U.S. Provisional Patent Application No. 61/192,404 filed on Sep. 18, 2008 entitled "INTERGRATED CIRCUIT WITH PIN-SELECTABLE MODE OF OPERATION AND LEVEL-SHIFT FUNCTIONALITY AND RELATED APPARATUS, SYSTEM, AND METHOD," which is hereby incorporated by reference.

This application is related to U.S. Provisional Patent Application No. 61/192,446 filed on Sep. 18, 2008 entitled "CHOPPED AUTO-ZEROED PING-PONG AMPLIFIER AND RELATED APPARATUS, SYSTEM, AND METHOD," which is hereby incorporated by reference.

TECHNICAL FIELD

This disclosure is generally directed to integrated circuits. More specifically, this disclosure is directed to an integrated circuit with pin-selectable mode of operation and level-shift functionality and related apparatus, system, and method.

BACKGROUND

Integrated circuits having analog and digital circuitry often include digital interface circuits and level-shift circuits. The digital interface circuits provide inputs to and receive outputs from the digital circuitry, allowing the analog circuitry to communicate with the digital circuitry. Digital interface circuits can often support multiple modes of operation. For example, some digital interface circuits include pins that can form a serial-type interface or a parallel-type interface depending on their mode of operation.

The digital interface circuits often operate at logic levels that differ from analog supply voltages. In those cases, the level-shift circuits perform logic-level translations, shifting voltages from the analog supply voltages to digital logic levels and vice versa. Oftentimes, at least one input pin can be used to provide one or more input voltages, where the input voltages define the digital logic levels used by level-shift circuits.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

FIGS. 1 through 10, discussed below, and the various embodiments used to describe the principles of the present invention in this patent document are by way of illustration only and should not be construed in any way to limit the scope of the invention. Those skilled in the art will understand that the principles of the present invention may be implemented in any type of suitably arranged device or system.

Figure 1:
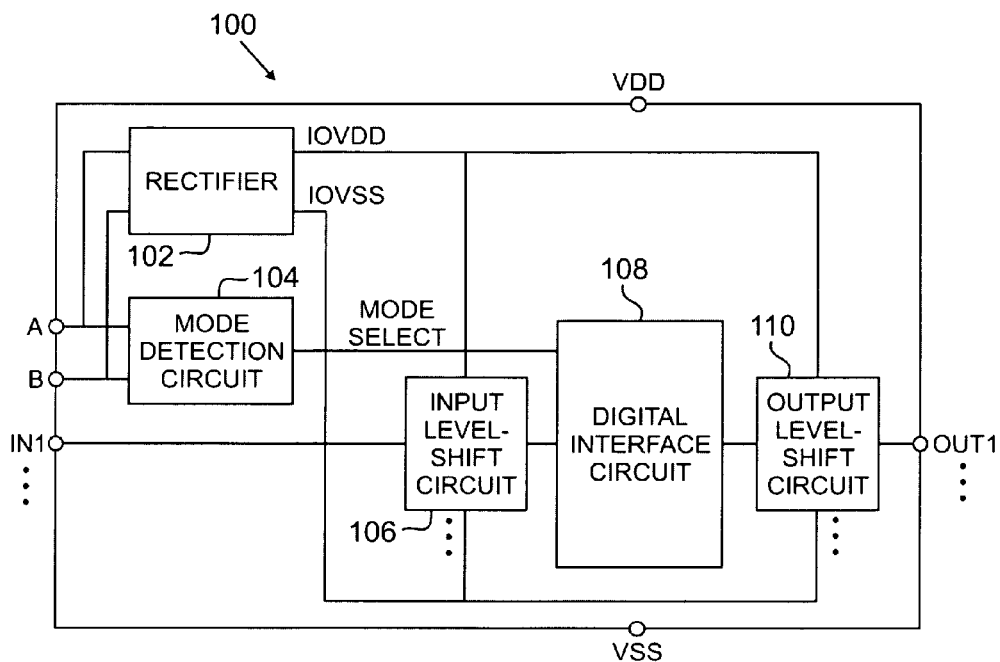
FIG. 1 illustrates a first example integrated circuit with pin-selectable mode of operation and level-shift functionality according to this disclosure.

FIG. 1 illustrates a first example integrated circuit 100 with pin-selectable mode of operation and level-shift functionality according to this disclosure. The embodiment of the integrated circuit 100 shown in FIG. 1 is for illustration only. Other embodiments of the integrated circuit 100 could be used without departing from the scope of this disclosure.

Figure 2:
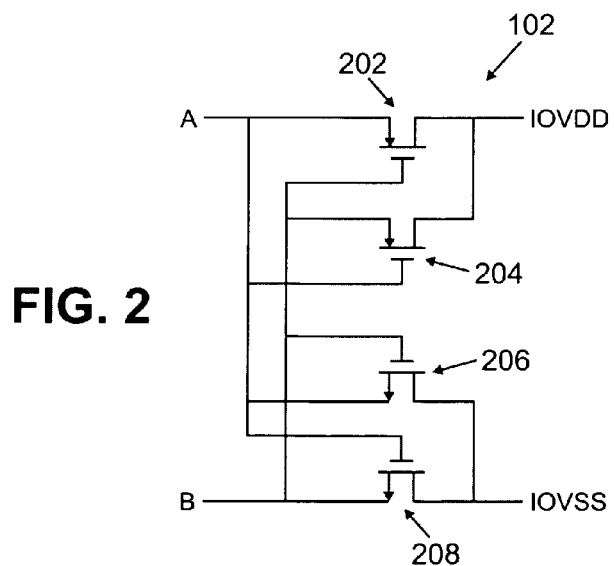
FIG. 2 illustrates an example rectifier in an integrated circuit according to this disclosure.

As shown in FIG. 1, the integrated circuit 100 includes a rectifier 102, a mode detection circuit 104, at least one input level-shift circuit 106, a digital interface circuit 108, and at least one output level-shift circuit 110. The rectifier 102 receives two input voltages (denoted "A" and "B") and passes the input voltages to digital high and low input/output voltage nets (denoted "IOVDD" and "IOVSS"). In this embodiment, the input voltage "A" could be less than or greater than the input voltage "B," and the rectifier 102 can output the greater voltage to the IOVDD net and the smaller voltage to the IOVSS net. The rectifier 102 includes any suitable structure for receiving input voltages and outputting appropriate voltages to voltage nets. An example embodiment of the rectifier 102 is shown in FIG. 2.

The mode detection circuit 104 determines a mode of operation for the digital interface circuit 108. As noted above, the input voltage "A" could be less than or greater than the input voltage "B." In these embodiments, the mode of operation for the digital interface circuit 108 could be controlled based on which input voltage is greater. For example, if the input voltage "A" is greater, the digital interface circuit 108 could form a parallel interface. If the input voltage "B" is greater, the digital interface circuit 108 could form a serial peripheral interface (SPI) or other serial interface. The mode detection circuit 104 can determine which input voltage is greater and output a "mode select" value to the digital interface circuit 108. The mode detection circuit 104 includes any suitable structure for selecting a mode based on input voltages. Note that these two modes (serial and parallel) are for illustration only and that any other or additional types of modes could be supported in the circuit 100. Another example is when a "normal" mode of operation is used by a customer and an "extended" mode of operation is used for production testing.

Figure 3:
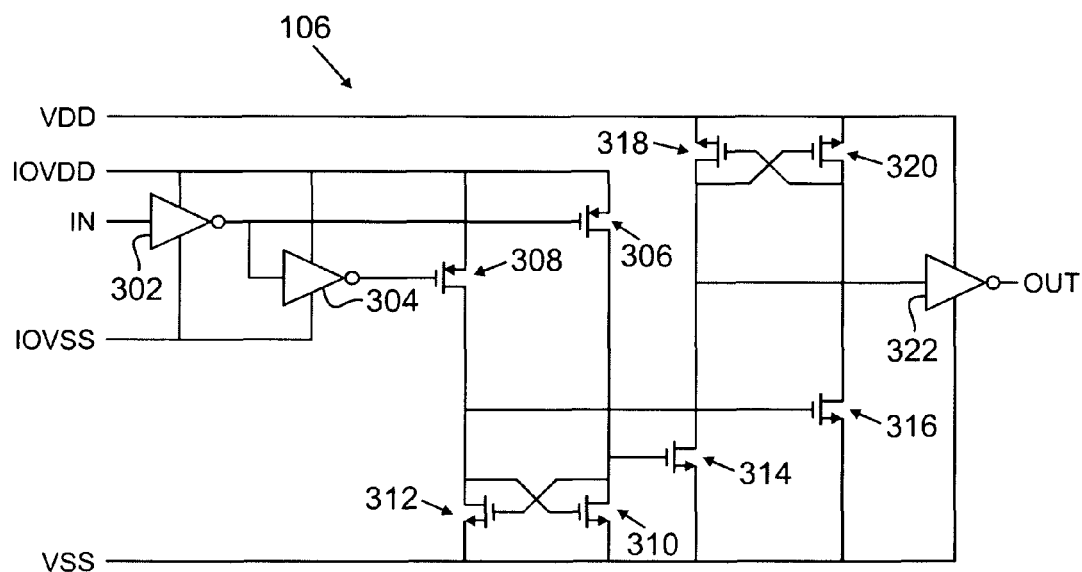
FIG. 3 illustrates an example input level-shift circuit in an integrated circuit according to this disclosure.

Each input level-shift circuit 106 receives an input signal (denoted "Inx") and performs a level-shift operation. Each input level-shift circuit 106 uses the voltages from the IOVDD and IOVSS nets to perform the level-shift operation. The input level-shift circuit 106 includes any suitable structure for level-shifting an input signal. An example embodiment of the input level-shift circuit 106 is shown in FIG. 3, which is described below.

The digital interface circuit 108 receives one or more level-shifted input signals and generates one or more output signals. The configuration of the digital interface circuit 108 may depend on the mode of operation determined by the mode detection circuit 104. For example, the digital interface circuit 108 could include four pins that function as a serial or parallel interface, depending on the mode selected by the mode detection circuit 104. The digital interface circuit 108 includes any suitable structure providing an interface to digital circuitry.

Figure 4:
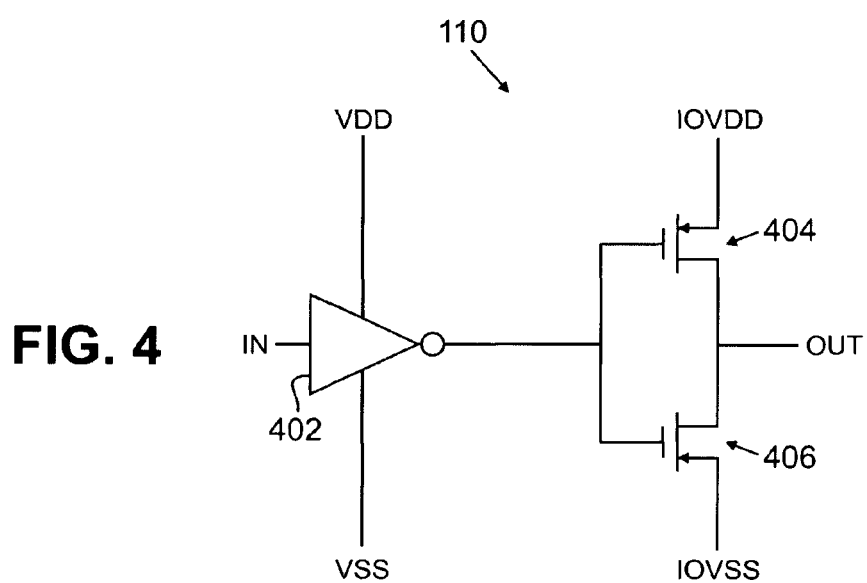
FIG. 4 illustrates an example output level-shift circuit in an integrated circuit according to this disclosure.

Each output level-shift circuit 110 receives a signal provided by the digital interface circuit 108 and perform a level-shift operation to produce an output signal (denoted "Outx") of the circuit 100. Each output level-shift circuit 110 uses the voltages from the IOVDD and IOVSS nets to perform the level-shift operation. The output level-shift circuit 110 includes any suitable structure for level-shifting an output signal. An example embodiment of the output level-shift circuit 110 is shown in FIG. 4, which is described below.

In one aspect of operation, the digital logic levels of the circuit 100 are based on the input voltages "A" and "B." More specifically, the input voltages "A" and "B" define the logic levels of the digital inputs and outputs of the digital interface circuit 108. A logic-high level is defined by the higher input voltage, while a logic-low level is defined by the lower input voltage. Not only that, the mode of operation of the digital interface circuit 108 affects one or more of its inputs and/or outputs, and the mode of operation can be determined using the same two input voltages "A" and "B." The digital interface circuit 108 can even be switched between the different modes of operation.

In this way, the circuit 100 enables the realization of two features that are often desirable for many programmable analog integrated circuits. First, the digital logic levels can be defined independently from the analog supplies using the input voltages "A" and "B." This may allow the integrated circuit 100 to interface with a microcontroller or other digital control circuitry operating from different digital supplies without requiring additional level-shift circuitry. Second, the digital interface circuit 108 can be switched between different modes of operation, and the same set of pins can be used in those modes. Moreover, both of these functions can be achieved using only two input/output pins (the pins for receiving the input voltages "A" and "B"). As a result, the same two pins can be used for setting the digital logic levels and for selecting the mode of operation for the digital interface. This reduces the pin count of the integrated circuit 100 and helps to avoid the use of complicated switching patterns or mode-select signals (which may be used in conventional circuits).

FIG. 2 illustrates an example rectifier 102 in an integrated circuit according to this disclosure. The embodiment of the rectifier 102 shown in FIG. 2 is for illustration only. Other embodiments of the rectifier 102 could be used without departing from the scope of this disclosure.

As shown in FIG. 2, the rectifier 102 includes four transistors 202-208. The input voltage "A" is applied to the sources of the transistors 202 and 206 and the gates of the transistors 204 and 208. The input voltage "B" is applied to the gates of the transistors 202 and 206 and the sources of the transistors 204 and 208. In this particular implementation, the transistors 202-204 represent p-channel metal oxide semiconductor (PMOS) transistors, and the transistors 206-208 represent n-channel metal oxide semiconductor (NMOS) transistors.

The transistors 202-208 operate to direct the higher input voltage to an IOVDD output and the lower input voltage to an IOVSS output. Although not shown, the backgates of the NMOS and PMOS transistors could be tied to VSS and VDD, respectively (if the input voltages are within the VSS and VDD supply rails).

FIG. 3 illustrates an example input level-shift circuit 106 according to this disclosure. The embodiment of the input level-shift circuit 106 shown in FIG. 3 is for illustration only. Other embodiments of the input level-shift circuit 106 could be used without departing from the scope of this disclosure.

As shown in FIG. 3, two inverters 302-304 are powered from the IOVDD and IOVSS nets, respectively. These inverters 302-304 translate an input voltage (denoted "In") to clean complementary logic levels. The outputs of the inverters 302-304 drive two transistors 306-308, respectively. The transistors 306-308 could represent PMOS transistors. The transistors 306-308 are connected to a latch formed by transistors 310-312, which could represent NMOS transistors. The latch formed by the transistors 310-312 translates the logic-low level to VSS. Two transistors 314-316 drive a latch formed by transistors 318-320. The transistors 314-316 could represent NMOS transistors, and the transistors 318-320 could represent PMOS transistors. The latch formed by the transistors 318-320 translates the logic-high level to VDD. An inverter 322 then produces a rail-to-rail output (denoted "Out").

FIG. 4 illustrates an example output level-shift circuit 110 according to this disclosure. The embodiment of the output level-shift circuit 110 shown in FIG. 4 is for illustration only. Other embodiments of the output level-shift circuit 110 could be used without departing from the scope of this disclosure.

In this example, the output level-shift circuit 110 includes an inverter 402 powered from VDD and VSS. The inverter 402 translates an input (denoted "In") to rail-to-rail logic levels referenced to VDD and VSS. Provided that IOVDD is less than or equal to VDD and IOVSS is greater than or equal to VSS, these levels can switch two output transistors 404-406 fully on and off, resulting in a logic output (denoted "Out") referenced to IOVDD and IOVSS. The transistor 404 could represent a PMOS transistor, and the transistor 406 could represent an NMOS transistor.

Figure 5:
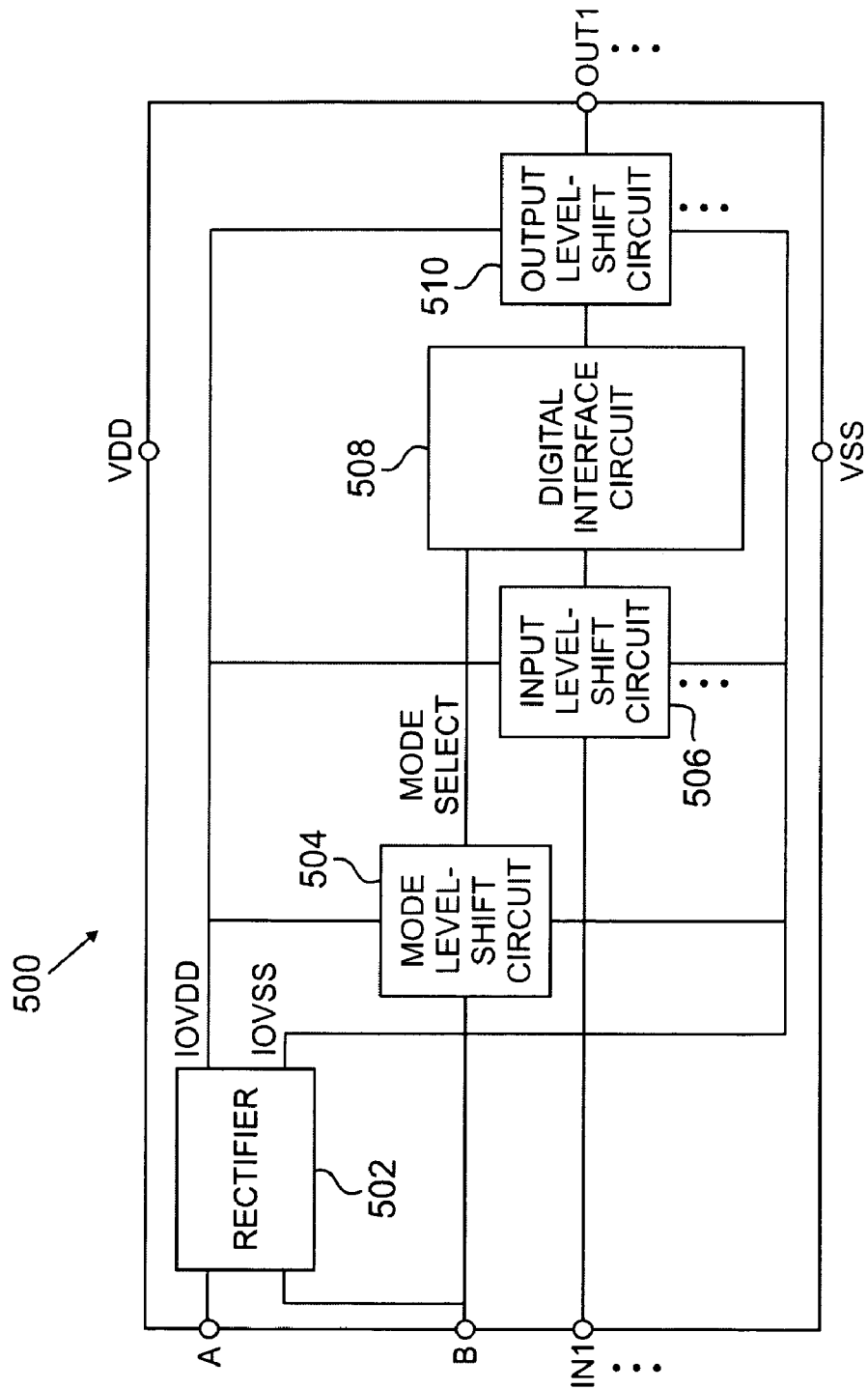
FIG. 5 illustrates a second example integrated circuit with pin-selectable mode of operation and level-shift functionality according to this disclosure.

FIG. 5 illustrates a second example integrated circuit 500 with pin-selectable mode of operation and level-shift functionality according to this disclosure. The embodiment of the integrated circuit 500 shown in FIG. 5 is for illustration only. Other embodiments of the integrated circuit 500 could be used without departing from the scope of this disclosure.

As shown in FIG. 5, the integrated circuit 500 includes a rectifier 502, a mode level-shift circuit 504, at least one input level-shift circuit 506, a digital interface circuit 508, and at least one output level-shift circuit 510. The components 502-504 and 508-510 may be the same as or similar to the corresponding components 102-104 and 108-110 described above.

In this example, the mode detection circuit 104 of FIG. 1 is implemented using the mode level-shift circuit 504. The input of the mode level-shift circuit 504 receives the input voltage "B." The mode level-shift circuit 504 generates a mode select signal that is high when the input voltage "B" exceeds the input voltage "A" and that is low when the input voltage "A" exceeds the input voltage "B." Alternatively, the mode level-shift circuit 504 could be connected to the input voltage "A,"

resulting in an inverted mode select signal. In some embodiments, the mode level-shift circuit 504 can be implemented using an input level-shift circuit as described above and shown in FIG. 3.

Figure 6:
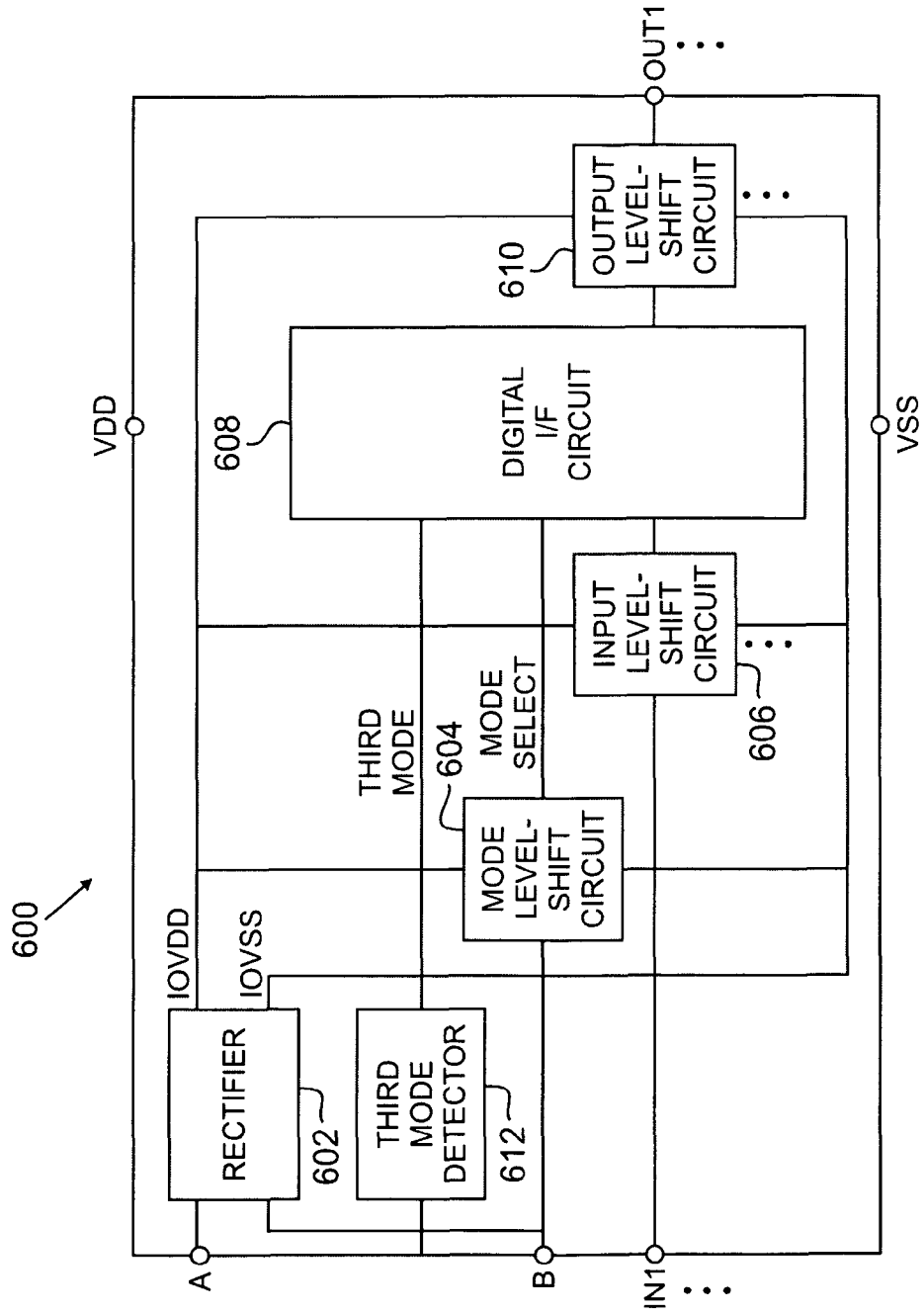
FIG. 6 illustrates a third example integrated circuit with pin-selectable mode of operation and level-shift functionality according to this disclosure.

FIG. 6 illustrates a third example integrated circuit 600 with pin-selectable mode of operation and level-shift functionality according to this disclosure. The embodiment of the integrated circuit 600 shown in FIG. 6 is for illustration only. Other embodiments of the integrated circuit 600 could be used without departing from the scope of this disclosure.

As shown in FIG. 6, the integrated circuit 600 includes a rectifier 602, a mode level-shift circuit 604, at least one input level-shift circuit 606, a digital interface circuit 608, and at least one output level-shift circuit 610. These components 602-610 may be the same as or similar to the corresponding components 602-610 described above.

The integrated circuit 600 also includes a third mode detector 612. As described above, one of two modes can be selected based on which of two input voltages "A" and "B" is greater. Optionally, a third mode of operation (such as a mode used for production testing) can be enabled. This third mode can be triggered when the input voltages "A" and "B" reach a condition not expected during normal use, such as when the input voltages "A" and "B" are both equal or close to VDD during power-up. The third mode detector 612 detects when this occurs and triggers the third mode using a test mode signal. As a particular example, this may allow production testing functionality to be enabled in the integrated circuit 600. The third mode detector 612 includes any suitable structure for identifying one or more conditions involving two or more input voltages. An example embodiment of the third mode detector 612 is shown in FIG. 7.

Figure 7:
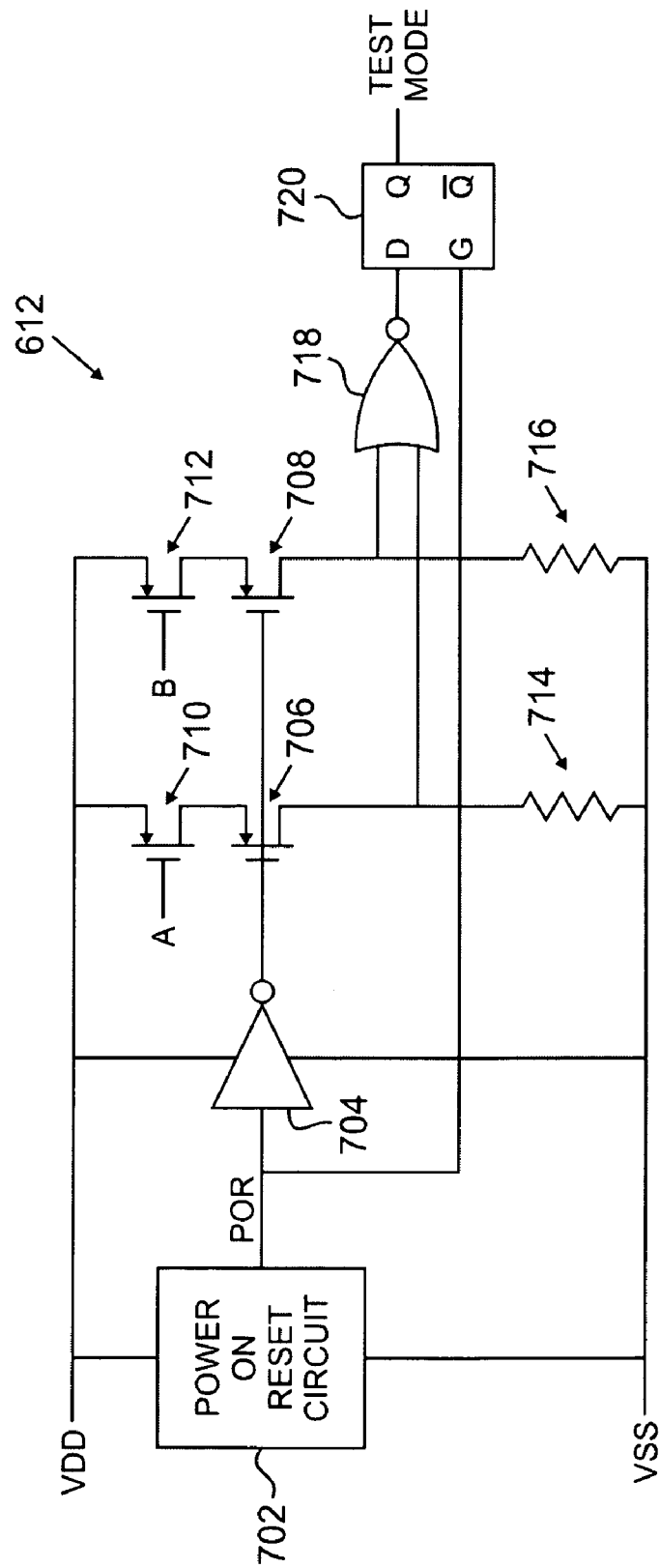
FIG. 7 illustrates an example third mode detection circuit in an integrated circuit according to this disclosure.

FIG. 7 illustrates an example third mode detection circuit 612 in an integrated circuit according to this disclosure. The embodiment of the third mode detection circuit 612 shown in FIG. 7 is for illustration only. Other embodiments of the third mode detection circuit 612 could be used without departing from the scope of this disclosure.

As shown in FIG. 7, a power-on reset circuit 702 can reset the third mode detection circuit 612 in response to a power-on event. The power-on reset circuit 702 generates a positive power-on reset (POR) pulse when the power-on event occurs. An inverter 704 inverts the output of the power-on reset circuit 702. During the POR pulse, two transistors 706-708 are switched on completely. If the input voltages "A" and "B" are less than a PMOS threshold voltage below VDD, two transistors 710-712 are off, and two resistors 714-716 pull the inputs of a NOR gate 718 low. The resulting high output of the NOR gate 718 is latched in a D-latch 720 when the POR signal goes low. This results in a test mode signal going high. If the input voltage "A" and/or the input voltage "B" is more than a PMOS threshold below VDD, one or both of the input voltages provided to the NOR gate 718 are pulled high. The resulting low output of the NOR gate 718 is latched in the D-latch 720 when the POR signal goes low, resulting in the test mode signal going low. The transistors 706-708 help to ensure that the circuit 612 does not draw any supply current after the POR pulse has gone low. The transistors 706-712 could represent PMOS transistors, and the resistors 714-716 could have any suitable resistance(s).

Although FIGS. 1 through 7 illustrate integrated circuits with pin-selectable mode of operation and level-shift functionality (and components of those integrated circuits), various changes may be made to FIGS. 1 through 7. For example, while example components are shown in various figures, other components performing the same or similar functions could be used. Also, while only two or three modes of operation were described above, an integrated circuit could support any suitable number of operational modes. Further, while only one input and one output are shown in FIGS. 1, 5, and 6, each integrated circuit could support any number of inputs and any number of outputs. In addition, various components in these figures could be combined, further subdivided, or omitted and additional components could be added according to particular needs. As a particular example, a single detection circuit could be used to detect one of three modes (rather than using two separate detectors).

Figure 8:
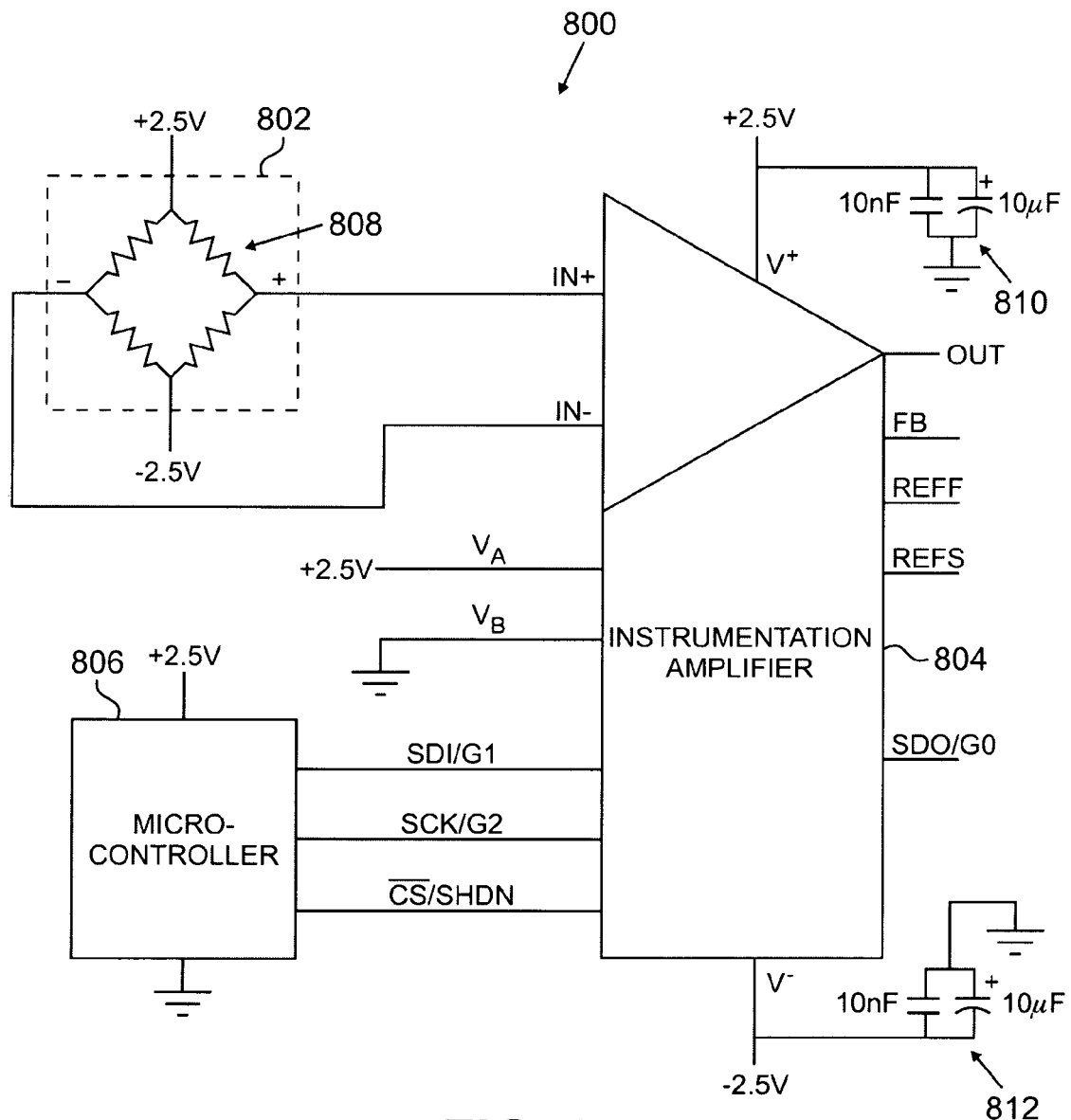
FIG. 8 illustrates an example system having an integrated circuit with pin-selectable mode of operation and level-shift functionality according to this disclosure.

FIG. 8 illustrates an example system 800 having an integrated circuit with pin-selectable mode of operation and level-shift functionality according to this disclosure. The embodiment of the system 800 shown in FIG. 8 is for illustration only. Other embodiments of the system 800 could be used without departing from the scope of this disclosure.

As shown in FIG. 8, the system 800 includes a sensor 802, an instrumentation amplifier 804, and a microcontroller 806. The sensor 802 generally represents any suitable structure for detecting or measuring one or more conditions. In this embodiment, the sensor 802 includes a resistive bridge 808, which is coupled to two supply voltages (+2.5V and −2.5V in this example). The resistive bridge 808 can function as a pressure sensor. Note, however, that any other suitable sensing structure could be used as the sensor 802, such as a bridge sensor, thermopile, or thermocouple.

The instrumentation amplifier 804 receives differential input signals (denoted IN+ and IN−) and amplifies a differential voltage while substantially rejecting common mode voltage in the input signals. The instrumentation amplifier 804 receives supply voltages $V^+$ and $V^-$, which represent the analog supply voltages for the instrumentation amplifier 804. Capacitors 810-812 are coupled to the supply voltages. In particular embodiments, the instrumentation amplifier 804 is capable of sensing differential input voltages in a common-mode range that extends from 100 mV below the negative supply voltage to 1.25V or 1.4V below the positive supply voltage. Also, in particular embodiments, a differential-mode input voltage range may be limited to +250 mV. Even at a maximum supply (such as 5V) and the lowest gain (such as 10×), the output can still swing rail-to-rail (assuming it is referenced to 2.5V).

Two force-sense reference pins (REFF and REFS) can be used in combination with two resistors and an operational amplifier. One resistor can be coupled to each force-sense reference pin. The non-inverting input of the operational amplifier can be coupled to a reference voltage. The output of the operational amplifier can be coupled to the resistor coupled to the REFF pin, and the inverting input of the operational amplifier can be coupled to the resistor coupled to the REFS pin. This can be used to provide a high-Z reference input while eliminating errors due to connection resistances.

In this example embodiment, two input voltages $V_A$ and $V_B$ can be received and used by the instrumentation amplifier 804 (although the amplifier 804 could operate without receiving the voltages $V_A$ and $V_B$). The input voltages $V_A$ and $V_B$ can be used to define the logic-high and logic-low values used by the instrumentation amplifier 804. The instrumentation amplifier 804 can also incorporate any of the integrated circuits 100, 500, 600 described above for determining the amplifier's mode of operation. This allows the instrumentation amplifier 804 to set its mode of operation based on the input voltages $V_A$ and $V_B$ used for level-shift operations.

In particular embodiments, the instrumentation amplifier 804 could operate as follows. The input voltages $V_A$ and $V_B$ define the logic levels of four digital pins. Those logic levels may lie between the analog supplies $V^+$ and $V^-$ of the instrumentation amplifier 804. If the $V_A$ voltage exceeds the $V_B$ voltage, the instrumentation amplifier 804 operates in "parallel mode." In parallel mode, the gain of the instrumentation amplifier 804 can be selected by applying certain logic levels to three digital input pins (G0-G2), and the instrumentation amplifier 804 can be switched into a power-saving shutdown mode by applying a logic high level to a shutdown pin (SHDN). In this example, since three pins are used for gain programming, up to eight gains could be supported (including a user-defined gain). The user-defined gain of the instrumentation amplifier 804 could be set to an arbitrary value (such as a value larger than 10) using two external resistors coupled to the FB pin, where the gain can be defined as G=(R1+R2)/R2. In these embodiments, the gain settings defined by the G0-G2 pins could be as follows: 000=10, 100=20, 010=50, 110=100, 001=200, 101=500, 011=1000, and 111=user defined. The accuracy of the pre-defined gain settings could be ±0.1 W.

If the $V_B$ voltage exceeds the $V_A$ voltage, the instrumentation amplifier 804 operates in a "serial mode." In the serial mode, the four digital pins operate as a serial peripheral interface, which includes a clock input (SCK), a data input (SDI), a chip select input (CS), and a data output (SDO). In particular embodiments, the instrumentation amplifier 804 can support double-buffered control registers for glitch-free transitions between settings, and multiple instrumentation amplifiers 804 could be cascaded (daisy-chained) by connecting the SDO pin of one amplifier 804 to the SDI pin of the next amplifier 804 and tying the CS pins together.

During production testing or at other times, the $V_A$ and $V_B$ voltages can be set equal to or near the positive analog supply $V^+$ during power-up, putting the instrumentation amplifier 804 into a "test mode." In the test mode, after power-up, the voltages $V_A$ and $V_B$ can behave the same when regular serial mode is used, but an extended SPI interface may be made available (through which a number of test registers could be accessed, in addition to the normal customer-accessible functionality).

The instrumentation amplifier 804 could support any other suitable features. For example, an external filter capacitor could be connected between the OUT and FB pins to implement a low-pass filter, where the corner frequency can be defined as $f_{-3dB}=1/(2\pi \cdot R_{filter} \cdot C_{filter})$. Note that the $R_{filter}$ value could be slightly gain dependent, such as 10%.

The instrumentation amplifier 804 represents any suitable structure for amplifying differential input signals while substantially rejecting common-mode voltage, such as an instrumentation amplifier having a rail-to-rail output, low input voltage noise, and high gain-bandwidth.

The microcontroller 806 is coupled to the serial interface implemented by the configurable pins of the instrumentation amplifier 804 in this example. The microcontroller 806 can receive amplified sensor readings from the instrumentation amplifier 804 and use the amplified sensor readings in any suitable manner. The microcontroller 806 includes any suitable structure for analyzing, or otherwise using data provided by the instrumentation amplifier 804.

Figure 9:
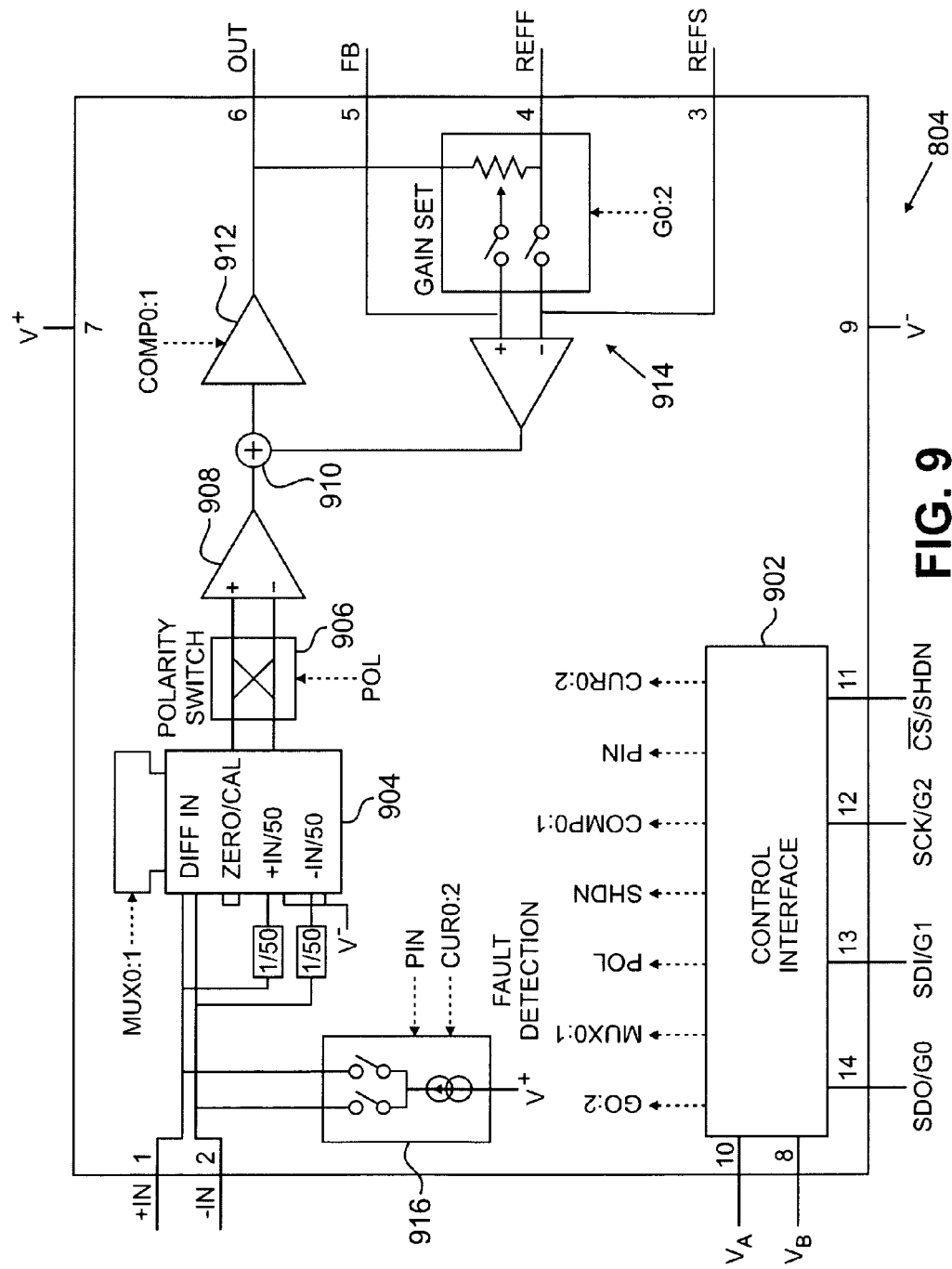
FIG. 9 illustrates an example instrumentation amplifier having an integrated circuit with pin-selectable mode of operation and level-shift functionality according to this disclosure.

FIG. 9 illustrates an example instrumentation amplifier 804 having an integrated circuit with pin-selectable mode of operation and level-shift functionality according to this disclosure. The embodiment of the instrumentation amplifier 804 shown in FIG. 9 is for illustration only. Other embodiments of the instrumentation amplifier 804 could be used without departing from the scope of this disclosure.

As shown in FIG. 9, a control interface 902 is coupled to two input voltage pins for receiving the $V_A$ and $V_B$ input voltages. The control interface 902 is also coupled to the four reconfigurable interface pins that can operate as a serial or parallel interface. The control interface 902 can use the input voltages $V_A$ and $V_B$ and various logic to generate control signals for other components of the instrumentation amplifier 804. The control interface 902 could, for example, implement a mode detection circuit and a third mode detector as described above. The control interface 902 can also configure the interface pins to operate as a serial or parallel interface based on the determined mode.

A multiplexer 904 receives various differential inputs and selects one of the differential inputs for output. In this example, the differential inputs include the differential input signals IN+/IN−, along with divided versions of the input signals IN+ and IN− (with $V^-$ as the other signal in those differential pairs). The multiplexer 904 can select one of the inputs to output based on control signals (MUX0:1) from the control interface 902. The multiplexer 904 can also be used to short the inputs and to measure the voltage at the +IN and −IN pins with respect to VSS.

A polarity switch 906 is coupled between the multiplexer 904 and a differential amplifier 908. The polarity switch 906 can pass the differential outputs from the multiplexer 904 to the differential amplifier 908. The polarity switch 906 can also selectively reverse the polarity of the differential outputs based on a control signal (POL) from the control interface 902. Note that the shorting and polarity reversal can be useful for system-level calibration and for "rectifying" differential input signals. Also, measuring $V_{+IN}$ and $V_{-IN}$ with respect to VSS can be used in conjunction with a fault detection current source to detect floating or shorted inputs and for monitoring the input common-mode voltage. The scale factor (1/50x) also provides a programmable overall gain of 0.2x, 0.4x, 1x, 2x, 4x, 10x, and 20x.

The differential amplifier 908 amplifies a difference between the differential signals provided to the amplifier 908. A combiner 910 combines an output of the differential amplifier 908 with a feedback signal from gain circuitry 914, and an output stage 912 amplifies the output of the combiner 910 and provides an output signal (denoted "Out"). The output stage 912 may operate based on frequency compensation settings (COMP0:1) from the control interface 902. The output stage 912 here performs frequency compensation, which can be adjusted to increase the bandwidth for higher gain settings. For example, Table 1 illustrates example gains and frequency compensations when the instrumentation amplifier 804 is operating in serial mode.

TABLE 1

| | BANDWIDTH | | | |
|---|---|---|---|---|
| GAIN | COMP = 00 (default) | COMP = 01 | COMP = 10 | COMP = 11 |
| 10x | 800 kHz | n/a | n/a | n/a |
| 20x | 400 kHz | n/a | n/a | n/a |
| 50x | 160 kHz | 480 kHz | n/a | n/a |
| 100x | 80 kHz | 240 kHz | 800 kHz | n/a |
| 200x | 40 kHz | 120 kHz | 400 kHz | n/a |
| 500x | 16 kHz | 48 kHz | 160 kHz | 480 kHz |
| 1000x | 8 kHz | 24 kHz | 80 kHz | 240 kHz |
| User-defined | >10x | >30x | >100x | >300x |
| gain GBW product | 8 MHz | 24 MHz | 80 MHz | 240 MHz |

Table 2 illustrates example gains and frequency compensations when the instrumentation amplifier 804 is operating in parallel mode. Here, the frequency compensation can be automatically linked to the gain setting to optimize bandwidth.

TABLE 2

| G0 | G1 | G2 | GAIN | COMP | BANDWIDTH |
|---|---|---|---|---|---|
| 0 | 0 | 0 | 10x | 00 | 800 kHz |
| 1 | 0 | 0 | 20x | 00 | 400 kHz |
| 0 | 1 | 0 | 50x | 01 | 480 kHz |
| 1 | 1 | 0 | 100x | 10 | 800 kHz |
| 0 | 0 | 1 | 200x | 10 | 400 kHz |
| 1 | 0 | 1 | 500x | 11 | 480 kHz |
| 0 | 1 | 1 | 1000x | 11 | 240 kHz |

In the user-defined gain mode (G0=G1=G2=1), COMP=00 so that the instrumentation amplifier 804 is stable for gains greater than 10× with a GBW product of 8 MHz.

The gain circuitry 914 controls the gain provided in the instrumentation amplifier 804. The gain could be based on resistors coupled to the gain circuitry 914 or based on control signals (G0:2) from the control interface 902. In addition, fault detection circuitry 916 could be used to detect open and shorted inputs, as well as degrading connections to signal sources. The fault detection circuitry 916 could operate based on a pin selection signal (PIN) and current signals (CUR0:2) from the control interface 902. The pin selection signal PIN controls whether a current source in the fault detection circuitry 916 is coupled to the +IN pin or the −IN pin. The current signals control the amount of current provided, such as when 000=disconnected and powered down, 100=10 nA, 010=100 nA, 110=1 µA, 001=10 µA, 101=100 µA, and 011 and 111=disconnected but powered (which may allow faster switch on and off, particularly for currents less than 1 µA). Using a combination of the multiplexer 904 and the current source in the fault detection circuitry 916, the following fault conditions can be detected:

- open input: inject test current and measure voltage at input pin, where the pin is pulled to VDD when open;
- input shorted to VDD or VSS: measure voltage at input pin, where if shorted it will not be at the expected common-mode level;
- inputs shorted together: measure differential input voltage change $\Delta V_{in}$ when test current is injected at either input pin, where no significant $\Delta V_{in}$ is measured if inputs are shorted; and
- degraded connection to signal source: measure differential input voltage change $\Delta V_{in}$ when test current is injected at either input pin, where total source resistance (sum of sensor and wiring resistance) is $R_{source} = \Delta V_{in}/I_{test}$ (this can be compared to an expected value or monitored over time).

The control interface 902 further supports a low-power or power-down mode. For example, if SHDN=1, the instrumentation amplifier 804 can enter a power-down mode in which the supply current is reduced to less than 1 µA. This mode could allow, for example, the outputs of multiple instrumentation amplifiers 804 to be coupled or multiplexed to a single device, such as to a single analog-to-digital converter (ADC) input. When powered-down, the output pin of the instrumentation amplifier 804 could have a high impedance, so that the outputs of multiple instrumentation amplifiers 804 can be tied together (provided only one instrumentation amplifier 804 is powered on at a given time during normal operation). In some embodiments, the power-down mode may not be the default mode at startup, so resistors could be added in series with the output pins of multiple instrumentation amplifiers 804 to limit the output currents that flow during the brief time after power-up when the instrumentation amplifiers 804 are powered simultaneously.

In particular embodiments, all outputs from the control interface 902 could be set to zero on power-up unless a fuse associated with a pin is blown (and defaults of bits without fuses can be metal-mask programmable).

Although FIGS. 8 and 9 illustrate an example system 800 having an integrated circuit with pin-selectable mode of operation and level-shift functionality (and components thereof), various changes may be made to FIGS. 8 and 9. For example, while example components are shown in these figures, other components performing the same or similar functions could be used. Also, these figures illustrate one example use of an integrated circuit with pin-selectable mode of operation and level-shift functionality. This type of integrated circuit could be used in a wide variety of other devices or systems, such as any programmable analog integrated circuit that has a digital interface capable of being reconfigured to alter the function of the integrated circuit. One specific example is a sensor interface circuit where various signal-processing parameters (such as gain, offset, linearity, and temperature compensation) can be programmed using a digital interface. Other specific examples can include portable instrumentation, medical instrumentation, precision low-side current sensing, and strain-gauge amplifiers.

Figure 10:
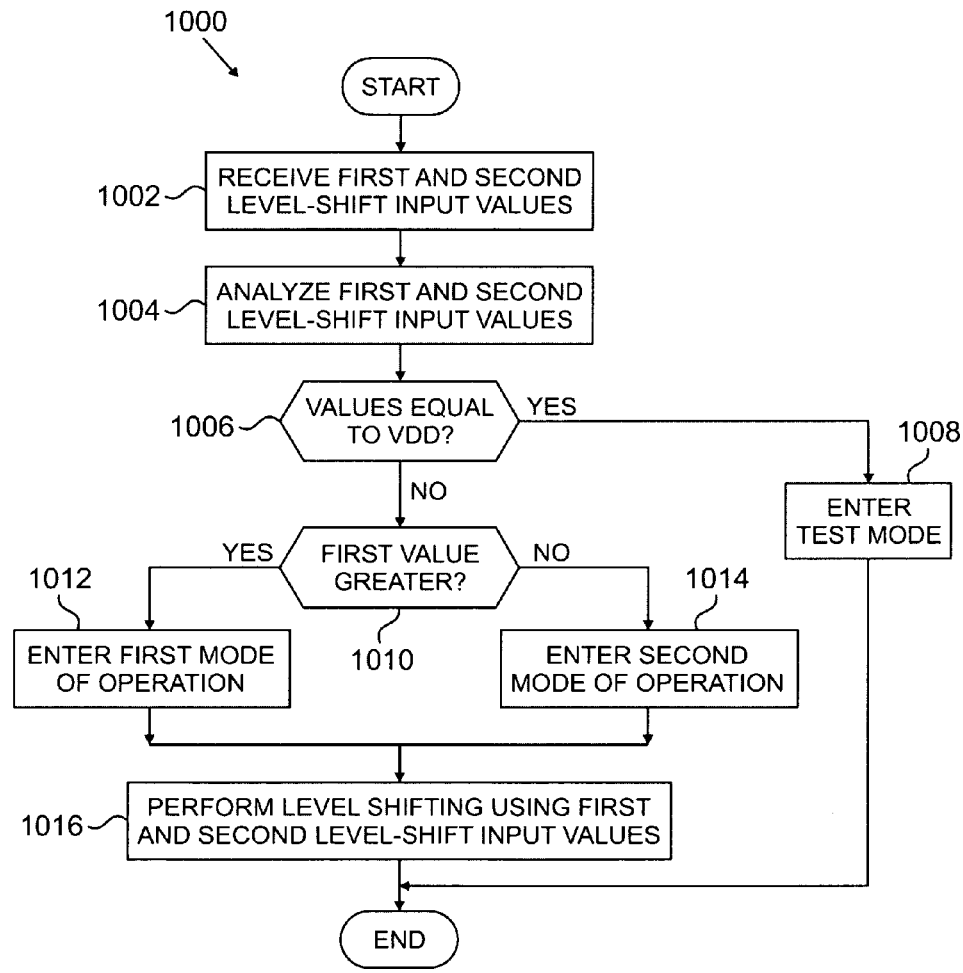
FIG. 10 illustrates an example method for pin-selectable mode of operation and level-shift functionality in an integrated circuit according to this disclosure.

FIG. 10 illustrates an example method 1000 for pin-selectable mode of operation and level-shift functionality in an integrated circuit according to this disclosure. The embodiment of the method 1000 shown in FIG. 10 is for illustration only. Other embodiments of the method 1000 could be used without departing from the scope of this disclosure.

First and second level-shift input values are received at step 1002. This could include, for example, receiving two level-shift input voltages that define the high and low digital logic values to be used in an integrated circuit. The level-shift input values are analyzed at step 1004. This could include, for example, determining whether the level-shift input voltages are equal or approximately equal to VDD or whether one of the level-shift input voltages is greater or smaller than the other.

If the level-shift input values are equal or approximately equal to VDD at step 1006, a test mode or other mode is entered at step 1008. In this mode, the pins of the integrated circuit could be configured as an extended SPI interface. This may allow, for example, production testing of the integrated circuit to occur. If the first level-shift input value is greater than the second level-shift input value at step 1010, a first mode of operation is entered at step 1012. Otherwise, a second mode of operation is entered at step 1014. In the first mode, the pins of the integrated circuit could be configured as an SPI interface. In the second mode, the pins of the integrated circuit could be configured as a parallel interface.

Level-shifting is performed using the two level-shift input values at step 1016. This could include, for example, shifting analog input values (referenced to two analog voltages) to shifted digital values (referenced to the level-shift input voltages). In this way, only two pins are needed in order to (i) set a mode of the integrated circuit and (ii) define the level-shift digital voltages.

Although FIG. 10 illustrates an example method 1000 for pin-selectable mode of operation and level-shift functionality in an integrated circuit, various changes may be made to FIG. 10. For example, while three modes are shown here (and one is a test mode), any suitable number and types of modes could be supported. Also, while shown as a series of steps, various steps in FIG. 10 could overlap, occur in parallel, occur in a different order, or occur multiple times.

It may be advantageous to set forth definitions of certain words and phrases that have been used within this patent document. The term "couple" and its derivatives refer to any direct or indirect communication between two or more components, whether or not those components are in physical contact with one another. The terms "transmit," "receive," and "communicate," as well as derivatives thereof, encompass both direct and indirect communication. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. An apparatus comprising:
a digital interface circuit configured to receive an input signal and provide an output signal, wherein at least a portion of the digital interface circuit is configurable based on a mode of operation of the digital interface circuit; and
a mode detector configured to provide a mode select signal identifying the mode of operation to the digital interface circuit, the mode detector configured to identify the mode of operation for the digital interface circuit based on first and second input voltages.

2. The apparatus of claim 1, further comprising:
an input level-shift circuit and an output level-shift circuit, the input level-shift circuit configured to shift a voltage level of the input signal, the output level-shift circuit configured to shift a voltage level of the output signal.

3. The apparatus of claim 2, wherein the input level-shifting and the output level-shifting are based on the first and second input voltages.

4. The apparatus of claim 1, wherein the mode detector is configured to select a first mode of operation when the first input voltage exceeds the second input voltage and a second mode of operation when the second input voltage exceeds the first input voltage.

5. The apparatus of claim 4, further comprising:
a second mode detector configured to select a third mode of operation when the first input voltage is substantially equal to the second input voltage.

6. The apparatus of claim 5, further comprising:
a power-on reset circuit configured to reset the second mode detector in response to a power-on event.

7. The apparatus of claim 1, wherein the mode of operation comprises one of:
a serial mode in which the digital interface circuit is configured as a serial interface; and
a parallel mode in which the digital interface circuit is configured as a parallel interface.

8. A system comprising:
a digital circuit;
a digital interface circuit configured to receive an input signal and provide an output signal to the digital circuit, wherein at least a portion of the digital interface circuit is configurable based on a mode of operation of the digital interface circuit; and
a mode detector configured to provide a mode select signal identifying the mode of operation to the digital interface circuit, the mode detector configured to identify the mode of operation for the digital interface circuit based on first and second input voltages.

9. The system of claim 8, further comprising:
an input level-shift circuit and an output level-shift circuit, the input level-shift circuit configured to shift a voltage level of the input signal, the output level-shift circuit configured to shift a voltage level of the output signal.

10. The system of claim 9, wherein the input level-shifting and the output level-shifting are based on the first and second input voltages.

11. The system of claim 8, wherein the mode detector is configured to select a first mode of operation when the first input voltage exceeds the second input voltage and a second mode of operation when the second input voltage exceeds the first input voltage.

12. The system of claim 11, further comprising:
a second mode detector configured to select a third mode of operation when the first input voltage is substantially equal to the second input voltage.

13. The system of claim 12, further comprising:
a power-on reset circuit configured to reset the second mode detector in response to a power-on event.

14. The system of claim 8, wherein the mode of operation comprises one of:
a serial mode in which the digital interface circuit is configured as a serial interface; and
a parallel mode in which the digital interface circuit is configured as a parallel interface.

15. A method comprising:
receiving first and second input voltages;
selecting a mode of operation for a digital interface circuit based on the first and second input voltages; and
configuring at least a portion of the digital interface circuit based on the selected mode of operation.

16. The method of claim 15, wherein selecting the mode of operation comprises comparing the first input voltage and the second input voltage.

17. The method of claim 16, wherein selecting the mode of operation further comprises:
selecting a first mode of operation when the first input voltage exceeds the second input voltage; and
selecting a second mode of operation when the second input voltage exceeds the first input voltage.

18. The method of claim 17, wherein selecting the mode of operation further comprises:
selecting a third mode of operation when the first input voltage is substantially equal to the second input voltage.

19. The method of claim 15, wherein the mode of operation comprises one of:
a serial mode in which the digital interface circuit is configured as a serial interface; and
a parallel mode in which the digital interface circuit is configured as a parallel interface.

20. The method of claim 15, further comprising:
level-shifting a voltage level of an input signal provided to the digital interface circuit; and
level-shifting a voltage level of an output signal provided by the digital interface circuit;
wherein the input level-shifting and the output level-shifting are based on the first and second input voltages.

* * * * *